United States Patent
Zanbaghi

(10) Patent No.: US 11,552,649 B1
(45) Date of Patent: Jan. 10, 2023

(54) ANALOG-TO-DIGITAL CONVERTER-EMBEDDED FIXED-PHASE VARIABLE GAIN AMPLIFIER STAGES FOR DUAL MONITORING PATHS

(71) Applicant: Cirrus Logic International Semiconductor Ltd., Edinburgh (GB)

(72) Inventor: Ramin Zanbaghi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/541,596

(22) Filed: Dec. 3, 2021

(51) Int. Cl.
  *H03M 3/00* (2006.01)
  *H03M 1/12* (2006.01)
  *H03M 1/10* (2006.01)

(52) U.S. Cl.
  CPC ............ *H03M 3/454* (2013.01); *H03M 3/422* (2013.01); *H03M 1/10* (2013.01); *H03M 1/12* (2013.01); *H03M 3/30* (2013.01)

(58) Field of Classification Search
  CPC ........ H03M 3/454; H03M 3/422; H03M 1/10; H03M 1/12; H03M 3/30
  See application file for complete search history.

(56) References Cited

U.S. PATENT DOCUMENTS

| | | | |
|---|---|---|---|
| 3,686,927 | A | 8/1972 | Scharton |
| 4,902,136 | A | 2/1990 | Mueller et al. |
| 5,374,896 | A | 12/1994 | Sato et al. |
| 5,684,722 | A | 11/1997 | Thorner et al. |
| 5,748,578 | A | 5/1998 | Schell |
| 5,857,986 | A | 1/1999 | Moriyasu |
| 6,050,393 | A | 4/2000 | Murai et al. |
| 6,278,790 | B1 | 8/2001 | Davis et al. |
| 6,294,891 | B1 | 9/2001 | McConnell et al. |
| 6,332,029 | B1 | 12/2001 | Azima et al. |

(Continued)

FOREIGN PATENT DOCUMENTS

| | | |
|---|---|---|
| AU | 2002347829 | 4/2003 |
| CN | 103165328 A | 6/2013 |

(Continued)

OTHER PUBLICATIONS

Invitation to Pay Additional Fees, Partial International Search Report and Provisional Opinion of the International Searching Authority, International Application No. PCT/US2020/052537, dated Jan. 14, 2021.

(Continued)

*Primary Examiner* — Joseph J Lauture
(74) *Attorney, Agent, or Firm* — Jackson Walker L.L.P.

(57) ABSTRACT

A delta-sigma modulator may include a loop filter, a quantizer, an input gain element having a programmable input gain and coupled between an input of the delta-sigma modulator and an input of the loop filter, a feedforward gain element having a programmable feedforward gain and coupled between the input of the delta-sigma modulator and an output of the loop filter, and a quantizer gain element having a quantizer gain and coupled between the output of the loop filter and an input of the quantizer. The programmable input gain is controlled in order to control a variable gain of the delta-sigma modulator. The programmable feedforward gain is controlled to be equal to the ratio of the programmable input gain and the quantizer gain such that the delta-sigma modulator has a fixed phase response.

20 Claims, 3 Drawing Sheets

(56) References Cited

U.S. PATENT DOCUMENTS

| | | | |
|---|---|---|---|
| 6,388,520 B2 | 5/2002 | Wada et al. |
| 6,567,478 B2 | 5/2003 | Oishi et al. |
| 6,580,796 B1 | 6/2003 | Kuroki |
| 6,683,437 B2 | 1/2004 | Fierling |
| 6,703,550 B2 | 3/2004 | Chu |
| 6,762,745 B1 | 7/2004 | Braun et al. |
| 6,768,779 B1 | 7/2004 | Nielsen |
| 6,784,740 B1 | 8/2004 | Tabatabaei |
| 6,906,697 B2 | 6/2005 | Rosenberg |
| 6,995,747 B2 | 2/2006 | Casebolt et al. |
| 7,042,286 B2 | 5/2006 | Meade et al. |
| 7,154,470 B2 | 12/2006 | Tierling |
| 7,277,678 B2 | 10/2007 | Rozenblit et al. |
| 7,333,604 B2 | 2/2008 | Zernovizky et al. |
| 7,392,066 B2 | 6/2008 | Haparnas |
| 7,456,688 B2 | 11/2008 | Okazaki et al. |
| 7,623,114 B2 | 11/2009 | Rank |
| 7,639,232 B2 | 12/2009 | Grant et al. |
| 7,777,566 B1 | 8/2010 | Drogi et al. |
| 7,791,588 B2 | 9/2010 | Tierling et al. |
| 7,825,838 B1 * | 11/2010 | Srinivas .............. H03M 1/1023 341/120 |
| 7,979,146 B2 | 7/2011 | Ullrich et al. |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Hwang et al. |
| 8,480,240 B2 | 7/2013 | Kashiyama |
| 8,572,293 B2 | 10/2013 | Cruz-Hernandez et al. |
| 8,572,296 B2 | 10/2013 | Shasha et al. |
| 8,593,269 B2 | 11/2013 | Grant et al. |
| 8,648,659 B2 | 2/2014 | Oh et al. |
| 8,648,829 B2 | 2/2014 | Shahoian et al. |
| 8,659,208 B1 | 2/2014 | Rose et al. |
| 8,754,757 B1 | 6/2014 | Ullrich et al. |
| 8,947,216 B2 | 2/2015 | Da Costa et al. |
| 8,981,915 B2 | 3/2015 | Birnbaum et al. |
| 8,994,518 B2 | 3/2015 | Gregorio et al. |
| 9,030,428 B2 | 5/2015 | Fleming |
| 9,063,570 B2 | 6/2015 | Weddle et al. |
| 9,070,856 B1 | 6/2015 | Rose et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Klppel |
| 9,329,721 B1 | 5/2016 | Buuck et al. |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,495,013 B2 | 11/2016 | Underkoffler et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,696,859 B1 | 7/2017 | Heller et al. |
| 9,697,450 B1 | 7/2017 | Lee |
| 9,715,300 B2 | 7/2017 | Sinclair et al. |
| 9,740,381 B1 | 8/2017 | Chaudhri et al. |
| 9,842,476 B2 | 12/2017 | Rihn et al. |
| 9,864,567 B2 | 1/2018 | Seo |
| 9,881,467 B2 | 1/2018 | Levesque |
| 9,886,829 B2 | 2/2018 | Levesque |
| 9,946,348 B2 | 4/2018 | Ullrich et al. |
| 9,947,186 B2 | 4/2018 | Macours |
| 9,959,744 B2 | 5/2018 | Koskan et al. |
| 9,965,092 B2 | 5/2018 | Smith |
| 10,032,550 B1 | 7/2018 | Zhang et al. |
| 10,055,950 B2 | 8/2018 | Saboune et al. |
| 10,074,246 B2 | 9/2018 | Da Costa et al. |
| 10,110,152 B1 | 10/2018 | Hajati |
| 10,171,008 B2 | 1/2019 | Nishitani et al. |
| 10,175,763 B2 | 1/2019 | Shah |
| 10,191,579 B2 | 1/2019 | Forlines et al. |
| 10,264,348 B1 | 4/2019 | Harris et al. |
| 10,275,087 B1 | 4/2019 | Smith |
| 10,564,727 B2 | 2/2020 | Billington et al. |
| 10,620,704 B2 | 4/2020 | Rand et al. |
| 10,667,051 B2 | 5/2020 | Stahl |
| 10,726,683 B1 | 7/2020 | Mondello et al. |
| 10,782,785 B2 | 9/2020 | Hu et al. |
| 10,795,443 B2 | 10/2020 | Hu et al. |
| 10,820,100 B2 | 10/2020 | Stahl et al. |
| 10,828,672 B2 | 11/2020 | Stahl et al. |
| 10,832,537 B2 | 11/2020 | Doy et al. |
| 10,848,886 B2 | 11/2020 | Rand |
| 10,860,202 B2 | 12/2020 | Sepehr et al. |
| 10,969,871 B2 | 4/2021 | Rand et al. |
| 11,069,206 B2 | 7/2021 | Rao et al. |
| 11,079,874 B2 | 8/2021 | Lapointe et al. |
| 11,139,767 B2 | 10/2021 | Janko et al. |
| 11,150,733 B2 | 10/2021 | Das et al. |
| 11,259,121 B2 | 2/2022 | Lindemann et al. |
| 11,460,526 B1 | 10/2022 | Foo et al. |
| 2001/0043714 A1 | 11/2001 | Asada et al. |
| 2002/0018578 A1 | 2/2002 | Burton |
| 2002/0085647 A1 | 7/2002 | Oishi et al. |
| 2003/0068053 A1 | 4/2003 | Chu |
| 2003/0214485 A1 | 11/2003 | Roberts |
| 2005/0031140 A1 | 2/2005 | Browning |
| 2005/0134562 A1 | 6/2005 | Grant et al. |
| 2006/0028095 A1 | 2/2006 | Maruyama et al. |
| 2006/0197753 A1 | 9/2006 | Hotelling |
| 2007/0024254 A1 | 2/2007 | Radecker et al. |
| 2007/0241816 A1 | 10/2007 | Okazaki et al. |
| 2008/0077367 A1 | 3/2008 | Odajima |
| 2008/0226109 A1 | 9/2008 | Yamakata et al. |
| 2008/0240458 A1 | 10/2008 | Goldstein et al. |
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0128306 A1 | 5/2009 | Luden et al. |
| 2009/0153499 A1 | 6/2009 | Kim et al. |
| 2009/0189867 A1 | 7/2009 | Krah |
| 2009/0278819 A1 | 11/2009 | Goldenberg et al. |
| 2009/0313542 A1 | 12/2009 | Cruz-Hernandez et al. |
| 2010/0013761 A1 | 1/2010 | Birnbaum et al. |
| 2010/0085317 A1 | 4/2010 | Park et al. |
| 2010/0141408 A1 | 6/2010 | Doy et al. |
| 2010/0141606 A1 | 6/2010 | Bae et al. |
| 2010/0260371 A1 | 10/2010 | Afshar |
| 2010/0261526 A1 | 10/2010 | Anderson et al. |
| 2011/0056763 A1 | 3/2011 | Tanase et al. |
| 2011/0075835 A1 | 3/2011 | Hill |
| 2011/0077055 A1 | 3/2011 | Pakula et al. |
| 2011/0141052 A1 | 6/2011 | Bernstein et al. |
| 2011/0161537 A1 | 6/2011 | Chang |
| 2011/0163985 A1 | 7/2011 | Bae et al. |
| 2011/0167391 A1 | 7/2011 | Momeyer et al. |
| 2012/0011436 A1 | 1/2012 | Jinkinson et al. |
| 2012/0105358 A1 | 5/2012 | Momeyer et al. |
| 2012/0112894 A1 | 5/2012 | Yang et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0249462 A1 | 10/2012 | Flanagan et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |

(56) References Cited

U.S. PATENT DOCUMENTS

| | | |
|---|---|---|
| 2013/0141382 A1 | 6/2013 | Simmons et al. |
| 2013/0275058 A1 | 10/2013 | Awad |
| 2013/0289994 A1 | 10/2013 | Newman et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0139327 A1 | 5/2014 | Bau et al. |
| 2014/0222377 A1 | 8/2014 | Bitan et al. |
| 2014/0226068 A1 | 8/2014 | Lacroix et al. |
| 2014/0292501 A1 | 10/2014 | Lim et al. |
| 2014/0340209 A1 | 11/2014 | Lacroix et al. |
| 2014/0347176 A1 | 11/2014 | Modarres et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070154 A1 | 3/2015 | Levesque et al. |
| 2015/0070260 A1 | 3/2015 | Saboune et al. |
| 2015/0084752 A1 | 3/2015 | Heubel et al. |
| 2015/0130767 A1 | 5/2015 | Myers et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0324116 A1 | 11/2015 | Marsden et al. |
| 2015/0325116 A1 | 11/2015 | Umminger, III |
| 2015/0341714 A1 | 11/2015 | Ahn et al. |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070392 A1 | 3/2016 | Wang et al. |
| 2016/0074278 A1 | 3/2016 | Muench et al. |
| 2016/0097662 A1 | 4/2016 | Chang et al. |
| 2016/0132118 A1 | 5/2016 | Park et al. |
| 2016/0162031 A1 | 6/2016 | Westerman et al. |
| 2016/0179203 A1 | 6/2016 | Modarres et al. |
| 2016/0239089 A1 | 8/2016 | Taninaka et al. |
| 2016/0246378 A1 | 8/2016 | Sampanes et al. |
| 2016/0291731 A1 | 10/2016 | Liu et al. |
| 2016/0328065 A1 | 11/2016 | Johnson |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0153760 A1 | 6/2017 | Chawda et al. |
| 2017/0168574 A1 | 6/2017 | Zhang |
| 2017/0169674 A1 | 6/2017 | Macours |
| 2017/0220197 A1 | 8/2017 | Matsumoto et al. |
| 2017/0256145 A1 | 9/2017 | Macours et al. |
| 2017/0277350 A1 | 9/2017 | Wang et al. |
| 2017/0031495 A1 | 12/2017 | Tse |
| 2017/0357440 A1 | 12/2017 | Tse |
| 2018/0021811 A1 | 1/2018 | Kutej et al. |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0095596 A1 | 4/2018 | Turgeman |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0196567 A1 | 7/2018 | Klein et al. |
| 2018/0224963 A1 | 8/2018 | Lee et al. |
| 2018/0237033 A1 | 8/2018 | Hakeem et al. |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1 | 10/2018 | Feng et al. |
| 2018/0301060 A1 | 10/2018 | Israr et al. |
| 2018/0321748 A1 | 11/2018 | Rao et al. |
| 2018/0323725 A1 | 11/2018 | Cox et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0035235 A1 | 1/2019 | Da Costa et al. |
| 2019/0227628 A1 | 1/2019 | Rand et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0294247 A1 | 9/2019 | Hu et al. |
| 2019/0296674 A1 | 9/2019 | Janko et al. |
| 2019/0297418 A1 | 9/2019 | Stahl |
| 2019/0311590 A1 | 10/2019 | Doy et al. |
| 2019/0341903 A1 | 11/2019 | Kim |
| 2019/0384393 A1 | 12/2019 | Cruz-Hernandez et al. |
| 2020/0117506 A1 | 4/2020 | Chan |
| 2020/0139403 A1 | 5/2020 | Palit |
| 2020/0150767 A1 | 5/2020 | Karimi Eskandary |
| 2020/0218352 A1 | 7/2020 | Macours et al. |
| 2020/0313529 A1 | 10/2020 | Lindemann |
| 2020/0313654 A1 | 10/2020 | Marchais et al. |
| 2020/0314969 A1 | 10/2020 | Marchais et al. |
| 2020/0403546 A1 | 12/2020 | Janko et al. |
| 2021/0108975 A1 | 4/2021 | Parada et al. |
| 2021/0125469 A1 | 4/2021 | Alderson |
| 2021/0157436 A1 | 5/2021 | Peso Parada et al. |
| 2021/0174777 A1 | 6/2021 | Marchais et al. |
| 2021/0175869 A1 | 6/2021 | Taipale |
| 2021/0200316 A1 | 7/2021 | Das et al. |
| 2021/0325967 A1 | 10/2021 | Khenkin et al. |
| 2021/0328535 A1 | 10/2021 | Khenkin et al. |
| 2021/0365118 A1 | 11/2021 | Rajapurkar et al. |
| 2022/0026989 A1 | 1/2022 | Rao et al. |

FOREIGN PATENT DOCUMENTS

| | | |
|---|---|---|
| CN | 204903757 U | 12/2015 |
| CN | 105264551 A | 1/2016 |
| CN | 106438890 A | 2/2017 |
| CN | 103403796 A | 7/2017 |
| CN | 106950832 A | 7/2017 |
| CN | 107665051 A | 2/2018 |
| CN | 107835968 A | 3/2018 |
| EP | 0784844 B1 | 6/2005 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| GB | 201620746 A | 1/2017 |
| IN | 201747044027 | 8/2018 |
| JP | H02130433 B2 | 5/1990 |
| JP | 08149006 A | 6/1996 |
| JP | 6026751 B2 | 11/2016 |
| JP | 6250985 | 12/2017 |
| JP | 6321351 | 5/2018 |

(56) References Cited

FOREIGN PATENT DOCUMENTS

| | | | |
|---|---|---|---|
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017113651 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/GB2020/052537, dated Mar. 9, 2021.
Office Action of the Intellectual Property Office, ROC (Taiwan) Patent Application No. 107115475, dated Apr. 30, 2021.
First Office Action, China National Intellectual Property Administration, Patent Application No. 2019800208570, dated Jun. 3, 2021.
International Search Report and Written Opinion of the International Searching Authority, International Application No. PCT/US2021/021908, dated Jun. 9, 2021.
Notice of Preliminary Rejection, Korean Intellectual Property Office, Application No. 10-2019-7036236, dated Jun. 29, 2021.
Combined Search and Examination Report, United Kingdom Intellectual Property Office, Application No. GB2018051.9, dated Jun. 30, 2021.
Communication pursuant to Rule 164(2)(b) and Article 94(3) EPC, European Patent Office, Application No. 18727512.8, dated Jul. 8, 2021.
Gottfried Behler: "Measuring the Loudspeaker's Impedance during Operation for the Derivation of the Voice Coil Temperature", AES Convention Preprint, Feb. 25, 1995 (Feb. 25, 1995), PARIS.
First Office Action, China National Intellectual Property Administration, Patent Application No. 2019800211287, dated Jul. 5, 2021.
Steinbach et al., Haptic Data Compression and Communication, IEEE Signal Processing Magazine, Jan. 2011.
Pezent et al., Syntacts Open-Source Software and Hardware for Audio-Controlled Haptics, IEEE Transactions on Haptics, vol. 14, No. 1, Jan.-Mar. 2021.
Examination Report under Section 18(3), United Kingdom Intellectual Property Office, Application No. GB2018051.9, dated Nov. 5, 2021.
Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29-Jul. 1, 2011.
Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
Danieau et al., Enhancing Audiovisual Experience with Haptic Feedback: A Survey on HAV, IEEE Transactions on Haptics, vol. 6, No. 2, Apr.-Jun. 2013.
Danieau et al., Toward Haptic Cinematography: Enhancing Movie Experiences with Camera-Based Haptic Effects, IEEE Computer Society, IEEE MultiMedia, Apr.-Jun. 2014.

Final Notice of Preliminary Rejection, Korean Patent Office, Application No. 10-2019-7036236, dated Nov. 29, 2021.
Examination Report under Section 18(3), United Kingdom Intellectual Property Office, Application No. GB2018050.1, dated Dec. 22, 2021.
Second Office Action, National Intellectual Property Administration, PRC, Application No. 2019800208570, dated Jan. 19, 2022.
International Search Report and Written Opinion of the International Searching Authority, International Application No. PCT/GB2019/050964, dated Sep. 3, 2019.
International Search Report and Written Opinion of the International Searching Authority, International Application No. PCT/GB2019/050770, dated Jul. 5, 2019.
Communication Relating to the Results of the Partial International Search, and Provisional Opinion Accompanying the Partial Search Result, of the International Searching Authority, International Application No. PCT/US2018/031329, dated Jul. 20, 2018.
Combined Search and Examination Report, UKIPO, Application No. GB1720424.9, dated Jun. 5, 2018.
International Search Report and Written Opinion of the International Searching Authority, International Application No. PCT/GB2019/052991, dated Mar. 17, 2020, received by Applicant Mar. 19, 2020.
Communication Relating to the Results of the Partial International Search, and Provisional Opinion Accompanying the Partial Search Result, of the International Searching Authority, International Application No. PCT/GB2020/050822, dated Jul. 9, 2020.
International Search Report and Written Opinion of the International Searching Authority, International Application No. PCT/US2020/024864, dated Jul. 6, 2020.
International Search Report and Written Opinion of the International Searching Authority, International Application No. PCT/GB2020/051035, dated Jul. 10, 2020.
International Search Report and Written Opinion of the International Searching Authority, International Application No. PCT/GB2020/050823, dated Jun. 30, 2020.
International Search Report and Written Opinion of the International Searching Authority, International Application No. PCT/GB2020/051037, dated Jul. 9, 2020.
International Search Report and Written Opinion of the International Searching Authority, International Application No. PCT/GB2020/050822, dated Aug. 31, 2020.
International Search Report and Written Opinion of the International Searching Authority, International Application No. PCT/GB2020/051438, dated Sep. 28, 2020.
First Examination Opinion Notice, State Intellectual Property Office of the People's Republic of China, Application No. 201880037435.X, dated Dec. 31, 2020.
International Search Report and Written Opinion of the International Searching Authority, International Application No. PCT/US2020/056610, dated Jan. 21, 2021.
Examination Report under Section 18(3), United Kingdom Intellectual Property Office, Application No. GB2106247.6, dated Mar. 31, 2022.
International Search Report and Written Opinion of the International searching Authority, Application No. PCT/US2022/033190, dated Sep. 8, 2022.
International Search Report and Written Opinion of the International searching Authority, Application No. PCT/US2022/033230, dated Sep. 15, 2022.
Communication pursuant to Article 94(3) EPC, European Patent Office, Application No. 18727512.8, dated Sep. 26, 2022.
Examination Report under Section 18(3), UKIPO, Application No. GB2112207.2, dated Nov. 7, 2022.

* cited by examiner

ANALOG-TO-DIGITAL CONVERTER-EMBEDDED FIXED-PHASE VARIABLE GAIN AMPLIFIER STAGES FOR DUAL MONITORING PATHS

FIELD OF DISCLOSURE

The present disclosure relates in general to methods, apparatuses, or implementations for monitoring loads with complex impedances. Embodiments set forth herein may also disclose improvements to how a displacement of a haptic actuator or other electromechanical load may be sensed and/or improvements to how a complex impedance is monitored.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a vibrational actuator (e.g., haptic transducer) 103 based on the signal. Controller 101 may be triggered by a trigger to output to the signal. The trigger may, for example, comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2\pi\sqrt{CM}} \quad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, and use conditions such as various different strengths of a user gripping of the device, the vibration resonance of the haptic transducer may vary from time to time.

FIG. 2 illustrates an example of a linear resonant actuator (LRA) modelled as a linear system. LRAs are non-linear components that may behave differently depending on, for example, the voltage levels applied, the operating temperature, and the frequency of operation. However, these components may be modelled as linear components within certain conditions. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V (t) with the output impedance Ro. The terminal voltage $V_T$ (t) may be sensed across the terminals of the haptic transducer. The mass-spring system 201 moves with velocity u(t).

A haptic system may require precise control of movements of the haptic transducer. Such control may rely on the magnetic force factor Bl, which may also be known as the electromagnetic transfer function of the haptic transducer. In an ideal case, magnetic force factor Bl can be given by the product B·l, where B is magnetic flux density and l is a total length of electrical conductor within a magnetic field. Both magnetic flux density B and length l should remain constant in an ideal case with motion occurring along a single axis.

In generating haptic vibration, an LRA may undergo displacement. In order to protect an LRA from damage, such displacement may be limited. Accordingly, accurate measurement of displacement may be crucial in optimizing LRA displacement protection algorithms. Accurate measurement of displacement may also enable increased drive levels of the LRA. While existing approaches measure displacement, such approaches have disadvantages. For example, displacement may be measured using a Hall sensor, but Hall sensors are often costly to implement.

SUMMARY

In accordance with the teachings of the present disclosure, the disadvantages and problems associated with existing approaches for monitoring a complex impedance may be reduced or eliminated.

In accordance with embodiments of the present disclosure, a delta-sigma modulator may include a loop filter, a quantizer, an input gain element having a programmable input gain and coupled between an input of the delta-sigma modulator and an input of the loop filter, a feedforward gain element having a programmable feedforward gain and coupled between the input of the delta-sigma modulator and an output of the loop filter, and a quantizer gain element having a quantizer gain and coupled between the output of the loop filter and an input of the quantizer. The programmable input gain is controlled in order to control a variable gain of the delta-sigma modulator. The programmable feedforward gain is controlled to be equal to the ratio of the programmable input gain and the quantizer gain such that the delta-sigma modulator has a fixed phase response.

In accordance with these and other embodiments of the present disclosure, a method for controlling a fixed-phase gain amplifier embedded in an analog-to-digital converter may include controlling an input gain element having a programmable input gain and coupled between an input of the delta-sigma modulator and an input of a loop filter of the delta-sigma modulator in order to control a variable gain of the delta-sigma modulator. The method may also include controlling a feedforward gain element having a programmable feedforward gain and coupled between the input of the delta-sigma modulator and an output of the loop filter to be equal to the ratio of the programmable input gain and a quantizer gain of a quantizer gain element coupled between the output of the loop filter and an input of a quantizer of the delta-sigma modulator, such that the delta-sigma modulator has a fixed phase response.

In accordance with these and other embodiments of the present disclosure, a controller for controlling a fixed-phase gain amplifier embedded in an analog-to-digital converter may include a first output for controlling an input gain element having a programmable input gain and coupled between an input of the delta-sigma modulator and an input of a loop filter of the delta-sigma modulator in order to control a variable gain of the delta-sigma modulator. The controller may also include a second output for controlling a feedforward gain element having a programmable feedforward gain and coupled between the input of the delta-sigma modulator and an output of the loop filter. The controller may further include logic for controlling the feedforward gain element to be equal to the ratio of the programmable input gain and a quantizer gain of a quantizer gain element coupled between the output of the loop filter and an input of a quantizer of the delta-sigma modulator, such that the delta-sigma modulator has a fixed phase response.

In accordance with these and other embodiments of the present disclosure, a system for measuring a plurality of physical quantities associated with an electrical component may include a plurality of sensing paths comprising a first sensing path for sensing a first physical quantity associated with the electrical component and a second sensing path for sensing a second physical quantity associated with the electrical component. Each of the first sensing path and the second sensing path may respectively include a respective delta-sigma modulator that comprises a loop filter, a quantizer, an input gain element having a programmable input gain and coupled between an input of the delta-sigma modulator and an input of the loop filter, a feedforward gain element having a programmable feedforward gain and coupled between the input of the delta-sigma modulator and an output of the loop filter, and a quantizer gain element having a quantizer gain and coupled between the output of the loop filter and an input of the quantizer. The programmable input gain may be controlled in order to control a variable gain of the delta-sigma modulator and the programmable feedforward gain may be controlled to be equal to the ratio of the programmable input gain and the quantizer gain such that the delta-sigma modulator has a fixed phase response.

In accordance with these and other embodiments of the present disclosure, a device may include an electrical component, a driver configured to drive a waveform to the electrical component, and a measurement subsystem for measuring a plurality of physical quantities associated with the electrical component, the measurement subsystem comprising a plurality of sensing paths comprising a first sensing path for sensing a first physical quantity associated with the electrical component and a second sensing path for sensing a second physical quantity associated with the electrical component. Each of the first sensing path and the second sensing path may respectively include a respective delta-sigma modulator that comprises a loop filter, a quantizer, an input gain element having a programmable input gain and coupled between an input of the delta-sigma modulator and an input of the loop filter, a feedforward gain element having a programmable feedforward gain and coupled between the input of the delta-sigma modulator and an output of the loop filter, and a quantizer gain element having a quantizer gain and coupled between the output of the loop filter and an input of the quantizer. The programmable input gain may be controlled in order to control a variable gain of the delta-sigma modulator and the programmable feedforward gain may be controlled to be equal to the ratio of the programmable input gain and the quantizer gain such that the delta-sigma modulator has a fixed phase response.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
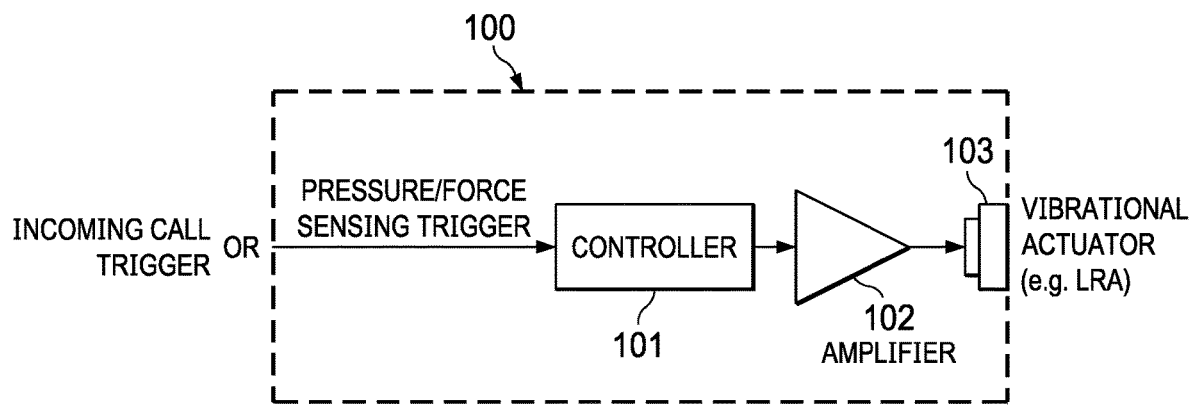
FIG. 1 illustrates an example of a vibro-haptic system in a device, as is known in the art.
Figure 2:
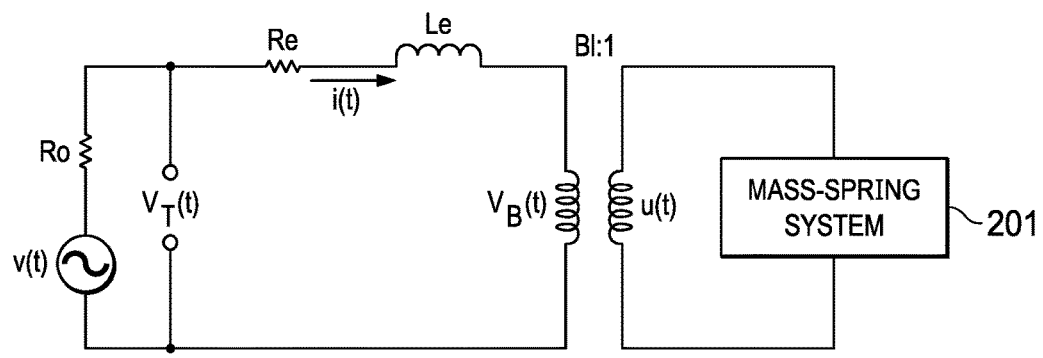
FIG. 2 illustrates an example of a Linear Resonant Actuator (LRA) modelled as a linear system, as is known in the art.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection-type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal may generally be an analog time varying voltage signal, for example, a time varying waveform.

To accurately sense displacement of an electromagnetic load, methods and systems of the present disclosure may determine an inductance of the electromagnetic load, and then convert the inductance to a position signal, as described in greater detail below. Further, to measure inductance of an electromagnetic load, methods and systems of the present disclosure may utilize either a phase measurement approach and/or a high-frequency pilot-tone driven approach, as also described in greater detail below.

To illustrate, an electromagnetic load may be driven by a driving signal V(t) to generate a sensed terminal voltage $V_T(t)$ across a coil of the electromagnetic load. Sensed terminal voltage $V_T(t)$ may be given by:

$$V_T(t) = Z_{COIL}I(t) + V_B(t)$$

wherein I(t) is a sensed current through the electromagnetic load, $Z_{COIL}$, is an impedance of the electromagnetic load, and $V_B(t)$ is the back-electromotive force (back-EMF) associated with the electromagnetic load.

As used herein, to "drive" an electromagnetic load means to generate and communicate a driving signal to the electromagnetic load to cause displacement of a movable mass of the electromagnetic load.

Because back-EMF voltage $V_B(t)$ may be proportional to velocity of the moving mass of the electromagnetic load, back-EMF voltage $V_B(t)$ may in turn provide an estimate of such velocity. Thus, velocity of the moving mass may be recovered from sensed terminal voltage $V_T(t)$ and sensed current I(t) provided that either: (a) sensed current I(t) is equal to zero, in which case $V_B = V_T$; or (b) coil impedance $Z_{COIL}$ is known or is accurately estimated.

Position of the moving mass may be related to a coil inductance $L_{COIL}$ of the electromagnetic load. At high frequencies significantly above the bandwidth of the electromagnetic load, back-EMF voltage $V_B(t)$ may become negligible and inductance may dominate the coil impedance $Z_{COIL}$. Sensed terminal voltage $V_{T@HF}(t)$ at high frequencies may be estimated by:

$$V_{T@HF}(t)Z_{COIL}I_{@HF}(t)$$

Hence, at high frequencies, the position of the moving mass of the electromagnetic load may be recovered from sensed terminal voltage $V_T(t)$ and sensed current I(t) by: (a) estimating the coil impedance at high frequency as $Z_{COIL@HF} \cong R_{@HF} + L_{@HF} \cdot S$, where $R_{@HF}$ is the resistive part of the coil impedance at high frequency, $L_{@HF}$ is the coil inductance at high frequency, and s is the Laplace transform; and (b) converting the measured inductance to a position signal. Velocity and/or position may be used to control vibration of the moving mass of the electromagnetic load.

Figure 3:
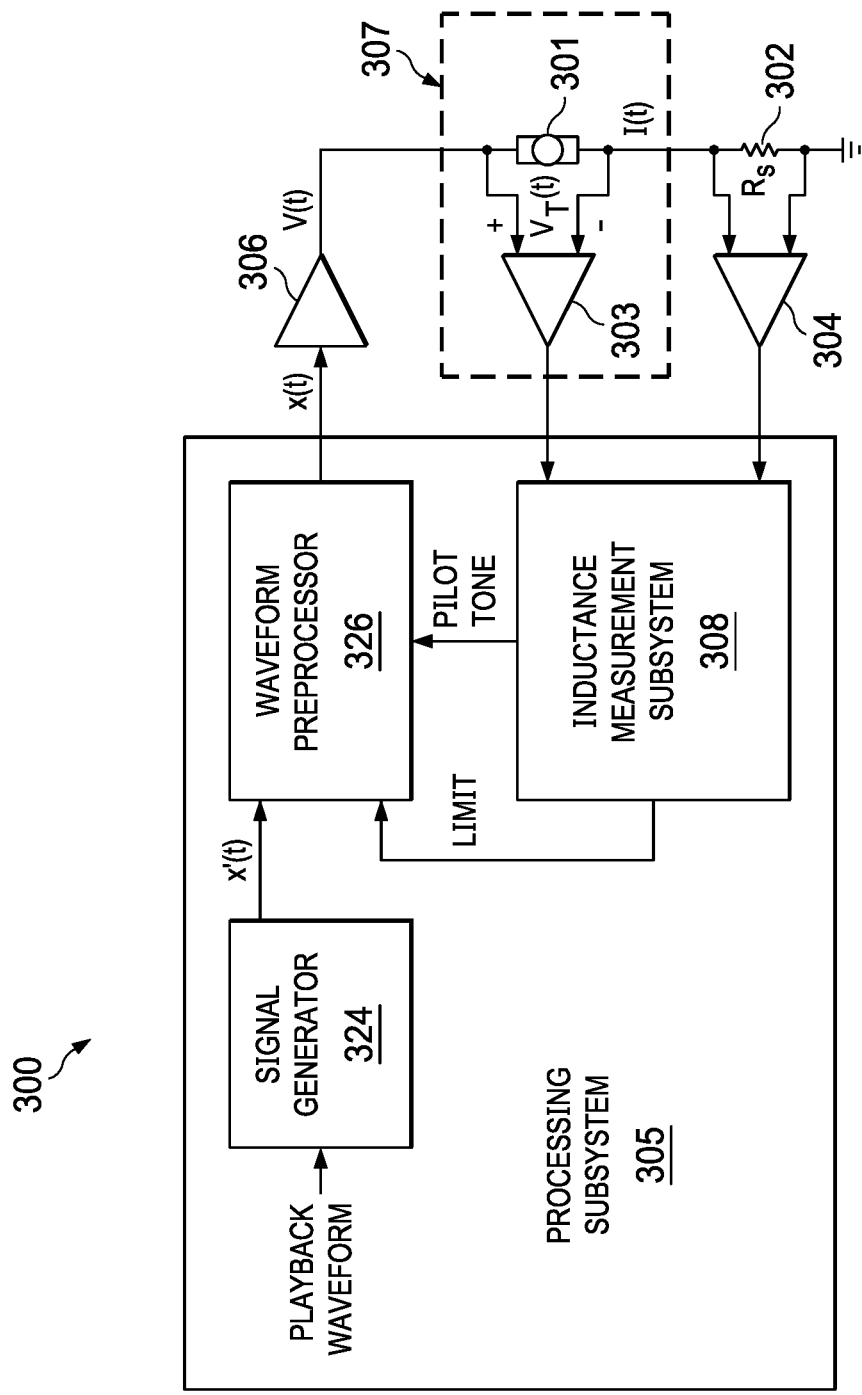
FIG. 3 illustrates selected components of an example host device, in accordance with embodiments of the present disclosure.

FIG. 3 illustrates selected components of an example host device 300 having an electromagnetic load 301, in accordance with embodiments of the present disclosure. Host device 300 may include, without limitation, a mobile device, home application, vehicle, and/or any other system, device, or apparatus that includes a human-machine interface. Electromagnetic load 301 may include any suitable load with a complex impedance, including without limitation a haptic transducer, a loudspeaker, a microspeaker, a piezoelectric transducer, a voice-coil actuator, a solenoid, or other suitable transducer.

In operation, a signal generator 324 of a processing subsystem 305 of host device 300 may generate a raw transducer driving signal x'(t) (which, in some embodiments, may be a waveform signal, such as a haptic waveform signal or audio signal). Raw transducer driving signal x'(t) may be generated based on a desired playback waveform received by signal generator 324.

Raw transducer driving signal x'(t) may be received by waveform preprocessor 326 which may modify raw transducer driving signal x'(t) based on a limiting signal generated by inductance measurement subsystem 308 and/or based on any other factor in order to generate processed transducer driving signal x(t).

Processed transducer driving signal x(t) may in turn be amplified by amplifier 306 to generate a driving signal V(t) for driving electromagnetic load 301. Responsive to driving signal V(t), a sensed terminal voltage $V_T$ (0 of electromagnetic load 301 may be sensed by a terminal voltage sensing block 307, for example a volt-meter, and converted to a digital representation by a first analog-to-digital conversion (ADC) subsystem 303. Similarly, sensed current I(t) may be converted to a digital representation by a second ADC subsystem 304. Current 1(t) may be sensed across a shunt resistor 302 having resistance $R_s$ coupled to a terminal of electromagnetic load 301.

As shown in FIG. 3, processing subsystem 305 may include an inductance measurement subsystem 308 that may estimate coil inductance $L_{COIL}$ of electromagnetic load 301. From such estimated coil inductance $L_{COIL}$, inductance measurement subsystem 308 may determine a displacement associated with electromagnetic load 301. If such displacement exceeds a threshold, high-frequency pilot-tone driven inductance measurement subsystem 308 may communicate a limiting signal (indicated by "LIMIT" in FIG. 3) to modify raw transducer driving signal x'(t) in a manner that prevents over-excursion in the displacement of electromagnetic load 301.

In operation, to estimate impedance $Z_{COIL}$, inductance measurement subsystem 308 may measure impedance in any suitable manner, including without limitation using the approaches set forth in U.S. patent application Ser. No. 17/497,110 filed Oct. 8, 2021, which is incorporated in its entirety by reference herein.

In particular, because electromagnetic load 301 may have a complex impedance, including a resistive component and an inductive component, sensed terminal voltage $V_T(t)$ and sensed current I(t) may be out of phase with one another. Accordingly, based on the measured magnitudes of sensed terminal voltage $V_T(t)$ and sensed current I(t) and their relative phase differences, inductance measurement subsystem 308 may determine the complex impedance of electromagnetic load 301, including estimated coil inductance LcoIL.

However, because inductance measurement subsystem 308 may employ phase-based determination of the complex impedance of electromagnetic load 301, it may be critical that the phase delay of first ADC subsystem 303 and second ADC subsystem 304 remain equal and fixed. Further, in some embodiments, it may be desirable to independently modify signal path gains of first ADC subsystem 303 and second ADC subsystem 304 without also modifying the fixed phase delay of either of first ADC subsystem 303 and second ADC subsystem 304.

Figure 4:
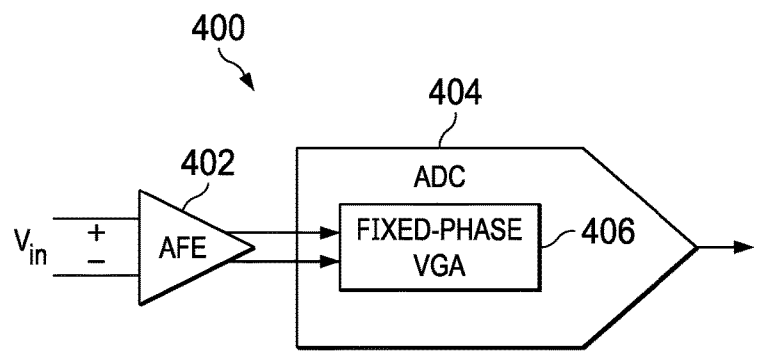
FIG. 4 illustrates selected components of an example analog-to-digital subsystem, in accordance with embodiments of the present disclosure.

FIG. 4 illustrates selected components of an example ADC subsystem 400, in accordance with embodiments of the present disclosure. ADC subsystem 400 as shown in FIG. 4 may be used to implement each of first ADC subsystem 303 and second ADC subsystem 304 depicted in FIG. 3.

As shown in FIG. 4, ADC subsystem 400 may include an analog front end (AFE) 402 configured to receive an input voltage $V_{in}$ (e.g., sensed terminal voltage $V_T$ (t) and sensed current I(t)) and an ADC 404 coupled to the output of AFE 402 and further including an embedded fixed-phase variable-gain amplifier (VGA) 406.

AFE 402 may include any system, device, or apparatus embodying analog signal conditioning circuitry (e.g., sensitive analog amplifiers, filters, and/or application-specific integrated circuits) configured to provide a configurable and flexible functional block to interface a component (e.g., electromagnetic load 301, sense resistor 302) to ADC 404.

ADC 404 may include any system, device, or apparatus configured to receive an analog signal at its input and convert such analog signal to an equivalent digital signal. As shown in FIG. 4, ADC 404 may include embedded fixed-phase VGA 406. Fixed-phase VGA 406 may include a system, device, or apparatus configured to apply a programmable signal gain to a signal received at its input in order to amplify or attenuate such signal, all while maintaining a fixed phase relationship between its input and its output as the programmable signal gain varies.

Figure 5:
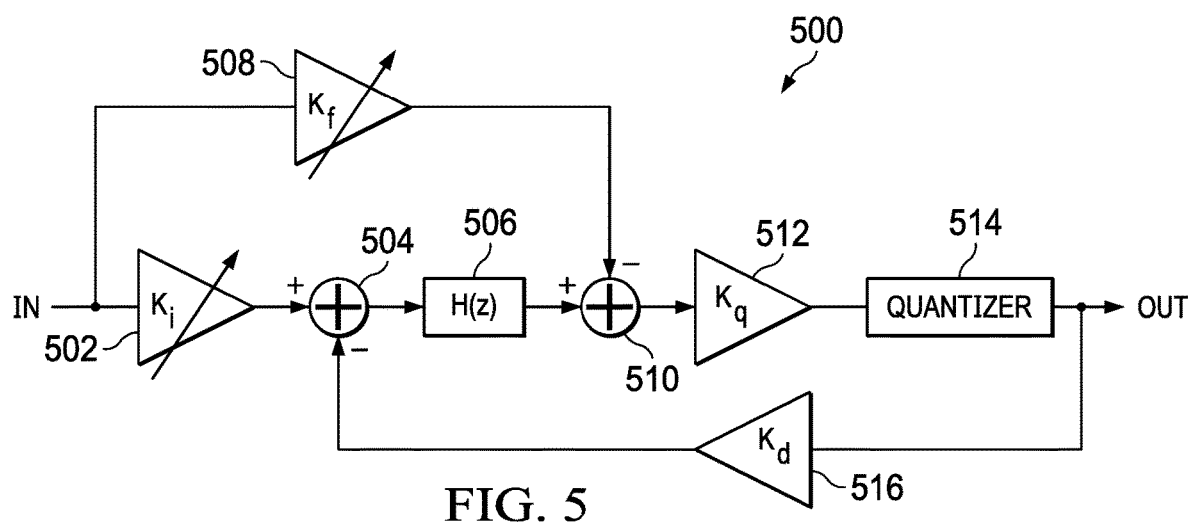
FIG. 5 illustrates selected components of an example delta-sigma modulator for use in an analog-to-digital converter, in accordance with embodiments of the present disclosure.

FIG. 5 illustrates selected components of an example delta-sigma modulator 500 for use in ADC 404, in accordance with embodiments of the present disclosure. In operation, delta-sigma modulator 500 may provide the analog-to-digital conversion functionality of ADC 404 as well as provide the fixed-phase variable-gain functionality of fixed-phase VGA 406.

As shown in FIG. 5, delta-sigma modulator 500 may comprise an input gain element 502 having a variable gain $k_i$ and configured to receive an input signal IN (e.g., which may represent an input signal received by ADC 404). A feedback combiner 504 may receive a feedback signal from a feedback gain element 516 and subtract such feedback signal from the signal generated by input gain element 502. A loop filter 506 may apply a response H(z) to the signal output by combiner 504.

Delta-sigma modulator 500 may also comprise a feedforward gain element 508 having a variable gain $k_f$ and also configured to receive input signal IN. A feedforward combiner 510 may sum the signal output by loop filter 506 and the signal output by feedforward gain element 508.

Delta-sigma modulator 500 may further include a quantizer gain element 512 having a fixed gain $k_q$ and configured to receive the signal output by combiner 510. Quantizer 514 may quantize the signal output by quantizer gain element 512 in order to generate a digitized output signal OUT (e.g., which may be or may otherwise correspond to the output of ADC 404).

Delta-sigma modulator 500 may additionally include feedback gain element 516 having a fixed gain $k_d$ and configured to receive digitized output signal OUT. Those of skill in the art may recognize that the signal transfer function of delta-sigma modulator 500 may be given by:

$$\frac{k_f k_q + k_i k_q H(s)}{1 + k_d k_q H(s)}$$

which may be rewritten as:

$$k_i \frac{\dfrac{k_f}{k_i} + H(s)}{\dfrac{1}{k_q} + k_d H(s)}$$

With such a signal transfer function, if $k_f = k_i / k_q$ and $k_d = 1$, the signal transfer function simplifies to $k_i$, which renders such transfer function equivalent to an all-pass filter with a variable gain provided $k_f$ is also varied to track if $k_f = k_i / k_q$.

In the systems and methods described above, a fixed-phase variable gain enables an overall system that is monitoring the two phase-sensitive quantities (e.g., sensed terminal voltage $V_T$ (t) and sensed current I(t)) to have an independent gain control without having an impact on the relative phase response between the monitored quantities. Independent gain control implementation using AFEs, as may be performed using traditional approaches, may have an impact on the relative phase response between the two monitored quantities. However, the fixed-phase VGA embedded within an ADC has little or no phase sensitivity because the signal transfer function for the embedded VGA has its signal transfer poles that are cancelled out by signal transfer zeroes.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A delta-sigma modulator comprising:
   a loop filter;
   a quantizer;
   an input gain element having a programmable input gain and coupled between an input of the delta-sigma modulator and an input of the loop filter;
   a feedforward gain element having a programmable feedforward gain and coupled between the input of the delta-sigma modulator and an output of the loop filter; and
   a quantizer gain element having a quantizer gain and coupled between the output of the loop filter and an input of the quantizer;
   wherein:
      the programmable input gain is controlled in order to control a variable gain of the delta-sigma modulator; and
      the programmable feedforward gain is controlled to be equal to the ratio of the programmable input gain and the quantizer gain such that the delta-sigma modulator has a fixed phase response.

2. The delta-sigma modulator of claim 1, wherein the quantizer gain is fixed.

3. The delta-sigma modulator of claim 1, wherein:
   the input of the loop filter is coupled to an output of the quantizer; and
   a feedback gain from the output of the quantizer to the input of the loop filter is one (1).

4. A method for controlling a fixed-phase gain amplifier embedded in an analog-to-digital converter, comprising:
   controlling an input gain element having a programmable input gain and coupled between an input of a delta-sigma modulator and an input of a loop filter of the delta-sigma modulator in order to control a variable gain of the delta-sigma modulator; and
   controlling a feedforward gain element having a programmable feedforward gain and coupled between the input of the delta-sigma modulator and an output of the loop filter to be equal to the ratio of the programmable input gain and a quantizer gain of a quantizer gain element coupled between the output of the loop filter and an input of a quantizer of the delta-sigma modulator, such that the delta-sigma modulator has a fixed phase response.

5. The method of claim 4, wherein the quantizer gain is fixed.

6. The method of claim 4, wherein:
   the input of the loop filter is coupled to an output of the quantizer; and
   a feedback gain from the output of the quantizer to the input of the loop filter is one (1).

7. A controller for controlling a fixed-phase gain amplifier embedded in an analog-to-digital converter, comprising:
   a first output for controlling an input gain element having a programmable input gain and coupled between an input of a delta-sigma modulator and an input of a loop filter of the delta-sigma modulator in order to control a variable gain of the delta-sigma modulator;
   a second output for controlling a feedforward gain element having a programmable feedforward gain and coupled between the input of the delta-sigma modulator and an output of the loop filter; and
   logic for controlling the feedforward gain element to be equal to the ratio of the programmable input gain and a quantizer gain of a quantizer gain element coupled between the output of the loop filter and an input of a quantizer of the delta-sigma modulator, such that the delta-sigma modulator has a fixed phase response.

8. The method of claim 7, wherein the quantizer gain is fixed.

9. The method of claim 7, wherein:
   the input of the loop filter is coupled to an output of the quantizer; and
   a feedback gain from the output of the quantizer to the input of the loop filter is one (1).

10. A system for measuring a plurality of physical quantities associated with an electrical component, the system comprising a plurality of sensing paths comprising:
    a first sensing path for sensing a first physical quantity associated with the electrical component; and
    a second sensing path for sensing a second physical quantity associated with the electrical component;
    wherein each of the first sensing path and the second sensing path respectively comprise a respective delta-sigma modulator that comprises:
       a loop filter;
       a quantizer;
       an input gain element having a programmable input gain and coupled between an input of the delta-sigma modulator and an input of the loop filter;
       a feedforward gain element having a programmable feedforward gain and coupled between the input of the delta-sigma modulator and an output of the loop filter; and
       a quantizer gain element having a quantizer gain and coupled between the output of the loop filter and an input of the quantizer;

wherein:
the programmable input gain is controlled in order to control a variable gain of the delta-sigma modulator; and
the programmable feedforward gain is controlled to be equal to the ratio of the programmable input gain and the quantizer gain such that the delta-sigma modulator has a fixed phase response.

11. The system of claim 10, wherein the quantizer gain for each respective delta-sigma modulator is fixed.

12. The system of claim 10, wherein in each respective delta-sigma modulator:
the input of the loop filter is coupled to an output of the quantizer; and
a feedback gain from the output of the quantizer to the input of the loop filter is one (1).

13. The system of claim 10, wherein:
the first physical quantity is a voltage associated with the electrical component; and
the second physical quantity is a current associated with the electrical component.

14. The system of claim 10, wherein the electrical component comprises an electromagnetic transducer.

15. A device comprising:
an electrical component;
a driver configured to drive a waveform to the electrical component; and
a measurement subsystem for measuring a plurality of physical quantities associated with the electrical component, the measurement subsystem comprising a plurality of sensing paths comprising:
a first sensing path for sensing a first physical quantity associated with the electrical component; and
a second sensing path for sensing a second physical quantity associated with the electrical component;
wherein each of the first sensing path and the second sensing path respectively comprise a respective delta-sigma modulator that comprises:
a loop filter;
a quantizer;
an input gain element having a programmable input gain and coupled between an input of the delta-sigma modulator and an input of the loop filter;
a feedforward gain element having a programmable feedforward gain and coupled between the input of the delta-sigma modulator and an output of the loop filter; and
a quantizer gain element having a quantizer gain and coupled between the output of the loop filter and an input of the quantizer; wherein:
the programmable input gain is controlled in order to control a variable gain of the delta-sigma modulator; and
the programmable feedforward gain is controlled to be equal to the ratio of the programmable input gain and the quantizer gain such that the delta-sigma modulator has a fixed phase response.

16. The device of claim 15, wherein the quantizer gain for each respective delta-sigma modulator is fixed.

17. The device of claim 15, wherein in each respective delta-sigma modulator:
the input of the loop filter is coupled to an output of the quantizer; and
a feedback gain from the output of the quantizer to the input of the loop filter is one (1).

18. The device of claim 15, wherein:
the first physical quantity is a voltage associated with the electrical component; and
the second physical quantity is a current associated with the electrical component.

19. The device of claim 15, wherein the electrical component comprises an electromagnetic transducer.

20. The device of claim 15, further comprising a control system configured to control the waveform based on the plurality of physical quantities.

* * * * *

UNITED STATES PATENT AND TRADEMARK OFFICE
CERTIFICATE OF CORRECTION

PATENT NO. : 11,552,649 B1
APPLICATION NO. : 17/541596
DATED : January 10, 2023
INVENTOR(S) : Ramin Zanbaghi It is certified that error appears in the above-identified patent and that said Letters Patent is hereby corrected as shown below:

In the Specification

1. In Column 5, Line 34, delete "$V_T(t)=\!—\!Z_{COIL}I(t)+V_B(t)$" and insert -- $V_T(t) = Z_{COIL}I(t) + V_B(t)$ --, therefor.

2. In Column 5, Line 49, delete "$V_B=V_T$;" and insert -- $V_B(t)=V_T(t)$; --, therefor.

3. In Column 5, Line 59, delete "$V_{T@HF}(t)Z_{COIL}I_{@HF}(t)$" and insert -- $V_{T@HF}(t) = Z_{COIL}I_{@HF}(t)$ --, therefor.

4. In Column 6, Line 31, delete "$V_T(0$" and insert -- $V_T(t)$ --, therefor.

5. In Column 6, Line 37, delete "1(t)" and insert -- I(t) --, therefor.

6. In Column 6, Line 67, delete "Lco1L." and insert -- $L_{COIL}$. --, therefor.

7. In Column 8, Line 3, delete "Those of" and insert the same on Line 4, before "skill" as new paragraph.

8. In Column 8, Line 23, delete "$k_i/k_g$." and insert -- $k_i/k_q$. --, therefor.

In the Claims

9. In Column 12, Line 11, in Claim 15, delete "wherein:" and insert the same on Line 12, as new sub-point.

Signed and Sealed this
Twentieth Day of June, 2023

Katherine Kelly Vidal
*Director of the United States Patent and Trademark Office*